(12) United States Patent
Zarcone et al.

(10) Patent No.: US 10,890,332 B2
(45) Date of Patent: Jan. 12, 2021

(54) OPERATING APPARATUS FOR AN ELECTRICAL DEVICE, AND ELECTRICAL DEVICE

(71) Applicant: E.G.O. Elektro-Geraetebau GmbH, Oberderdingen (DE)

(72) Inventors: Carmelo Zarcone, Bretten (DE); Wolfgang Thimm, Karlsruhe (DE); Lutz Ose, Sternenfels (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 0 days.

(21) Appl. No.: 16/398,904

(22) Filed: Apr. 30, 2019

(65) Prior Publication Data
US 2019/0338957 A1      Nov. 7, 2019

(30) Foreign Application Priority Data
May 3, 2018   (DE) .................. 10 2018 206 807

(51) Int. Cl.
*F24C 7/08*      (2006.01)
*F21V 33/00*     (2006.01)
(Continued)

(52) U.S. Cl.
CPC .......... *F24C 7/087* (2013.01); *F21V 33/0044* (2013.01); *F24C 7/082* (2013.01);
(Continued)

(58) Field of Classification Search
None
See application file for complete search history.

(56) References Cited

U.S. PATENT DOCUMENTS

| | | | |
|---|---|---|---|
| 4,254,202 A * | 3/1981 | Matsumoto | G03G 15/09 399/343 |
| 7,375,511 B2 * | 5/2008 | Kang | G06F 3/0362 324/207.2 |

(Continued)

FOREIGN PATENT DOCUMENTS

| | | |
|---|---|---|
| DE | 10218294 A1 | 11/2003 |
| DE | 102005049995 A1 | 4/2007 |

(Continued)

OTHER PUBLICATIONS

European Patent Office, European Search Report for European Patent Application No. 19171098.7, dated Sep. 20, 2019, (9 pages), Germany.

(Continued)

*Primary Examiner* — Ashok Patel
(74) *Attorney, Agent, or Firm* — Alston & Bird LLP

(57) ABSTRACT

An operating apparatus for an electrical device has a closed transparent control panel, lighting means underneath the control panel in order to shine through, a plurality of holding magnets underneath the control panel and a movable operating element being held magnetically on the front side of the control panel that can be moved with respect to the lighting means and the holding magnets. A plurality of counter-magnets are provided in the operating element for interacting with the holding magnets in order to guide the operating element as an operating movement and hold it on the control panel, wherein sensor means underneath the control panel detect a rotational position of the operating element. The operating element is transparent in a direction from the lighting means to the operating element, wherein, for this purpose, it has a plurality of transparent regions that are separated from one another without transmission between one another.

20 Claims, 3 Drawing Sheets

(51) Int. Cl.
  *G01R 33/02* (2006.01)
  *F21V 8/00* (2006.01)
  *G05G 1/015* (2008.04)
  *G05G 1/08* (2006.01)
  *G05G 1/10* (2006.01)
  *H05K 5/00* (2006.01)
  *G05G 5/26* (2006.01)

(52) U.S. Cl.
  CPC ......... *G01R 33/02* (2013.01); *G02B 6/0008* (2013.01); *G05G 1/015* (2013.01); *G05G 1/08* (2013.01); *G05G 1/105* (2013.01); *G05G 5/26* (2013.01); *H05K 5/0017* (2013.01); *G05G 2505/00* (2013.01)

(56) References Cited

U.S. PATENT DOCUMENTS

| | | | |
|---|---|---|---|
| 7,642,673 B2 | 1/2010 | Baier | |
| 7,780,325 B2* | 8/2010 | Collomb | H01H 19/025 362/551 |
| 7,943,878 B2* | 5/2011 | Hamm | G05G 1/105 200/316 |
| 8,076,603 B2* | 12/2011 | Huang | H01H 3/20 200/336 |
| 8,772,721 B2* | 7/2014 | Hasselbrinck | B60K 37/06 250/338.1 |
| 9,587,836 B2* | 3/2017 | Begero | F24C 3/122 |
| 9,766,757 B2* | 9/2017 | Keller | G06F 3/044 |
| 10,162,436 B2 | 12/2018 | Goss et al. | |
| 2008/0068117 A1* | 3/2008 | Boss | H03K 17/97 335/206 |
| 2010/0020042 A1* | 1/2010 | Stelandre | G06F 3/046 345/174 |
| 2016/0181028 A1 | 6/2016 | Ebrom et al. | |

FOREIGN PATENT DOCUMENTS

| | | |
|---|---|---|
| DE | 102010017992 B3 | 3/2011 |
| DE | 102010010574 A1 | 9/2011 |
| DE | 102010042146 A1 | 4/2012 |
| DE | 102011002410 A1 | 7/2012 |
| DE | 102011007112 A1 | 10/2012 |
| DE | 102011007463 A1 | 10/2012 |
| DE | 102012213693 A1 | 2/2014 |
| DE | 102015212915 A1 | 1/2017 |
| EP | 1775650 A2 | 4/2007 |
| EP | 2251762 A2 | 11/2010 |
| EP | 2444736 A2 | 4/2012 |
| WO | WO-2012/080156 A1 | 6/2012 |
| WO | WO-2016/026751 A1 | 2/2016 |

OTHER PUBLICATIONS

German Patent Office, Examination Report for German Patent Application No. 102018206807.0, dated Apr. 17, 2019, 8 pages, Germany.

* cited by examiner

OPERATING APPARATUS FOR AN ELECTRICAL DEVICE, AND ELECTRICAL DEVICE

CROSS-REFERENCE TO RELATED APPLICATIONS

This application claims priority to German Application No. 10 2018 206 807.0, filed May 3, 2018, the contents of which are hereby incorporated herein in its entirety by reference.

BACKGROUND

The invention relates to an operating apparatus for an electrical device, and to an electrical device provided with such an operating apparatus. The electrical device is in particular a hob.

DE 10 2010 010 574 A1 generally discloses an operating device that is designed in particular for a vehicle. It has a movable operating element on a control panel, and an operation, in particular a setting operation, is performed by rotation.

DE 10 2011 007 463 A1 discloses a further operating apparatus that is designed for a household appliance, such as for example a hob. In this case, a rotatable operating element may be removed, said operating element being held by magnetic force.

DE 10 2010 042 146 A1 discloses a further operating apparatus for a hob, which operating apparatus has a rotatable and removable operating element. It is designed so as to be transparent or open in a central region. A lens is arranged there so as to be able to depict a number, displayed below, in magnified form.

BRIEF SUMMARY

The invention is based on the object of providing an operating apparatus mentioned at the outset and an electrical device provided therewith, by way of which it is possible to solve problems from the prior art and in particular to depict a luminous display well on a movable operating element of the operating apparatus, with manageable effort and with a workable and robust design.

This object is achieved by an operating apparatus and by an electrical device having the features of the claims contained herein. Advantageous and preferred refinements of the invention are contained in the further claims and are explained in more detail below. In this case, some of the features are described only for the operating apparatus or only for the electrical device. However, independently of this, they are intended to apply independently and autonomously from one another both to the operating apparatus and to the electrical device. The wording of the claims is made with express reference to the content of the description.

It is provided that the operating apparatus has a flat control panel that is closed and at least regionally transparent. It also has lighting means underneath the control panel in order to shine through the control panel from below so as to generate a luminous display that is visible from above. It furthermore has at least one holding magnet underneath the control panel. Said holding magnet serves to hold a movable operating element that is arranged on the front side of the control panel so as to be able to move with respect to the lighting means and with respect to the at least one holding magnet, such that it is held magnetically. For this magnetic holding, the operating apparatus has at least one counter-magnet in or on the operating element for interacting with the at least one holding magnet through attractive magnetic force. This is designed such that the operating element, in the case of a movement for operating or an operating movement, is guided by an attractive magnetic force between the holding magnet and the counter-magnet. The operating element is thus held on the control panel, but is at the same time still able to move in a plane parallel to the surface of the control panel, in particular in a displaceable and/or rotatable manner. Instead of a holding magnet and counter-magnet made from conventional magnetic material, a magnetizable material, in particular parts made from iron, could also be used here. The other part is then a corresponding magnet, such that the two parts together are able to develop a sufficient attractive magnetic force for stable holding. Lastly, sensor means are also provided on or underneath the control panel, advantageously opposite the operating element, these being designed to detect a position or a rotational setting or rotational position of the operating element.

According to the invention, the operating element is transparent in or along a direction that runs from the lighting means to the operating element. In particular, the operating element is transparent between an underside and an upper side or an outer side. To this end, the operating element advantageously has a plurality of transparent regions, and these regions are disconnected from one another or separated from one another. No transmission of light takes place between these regions, at least between some of these regions. It is thereby possible for the regions for example to have a specific shape or for a specific light to be shone into them and only this then being able to be seen from above on the operating element.

By virtue of the fact that the lighting means are arranged underneath the control panel, as are the sensor means, it is possible to design the operating element without a dedicated power supply and without dedicated active components. It is thereby easy to handle, robust, and has a long life. This advantageously makes it possible to design the operating element with these aspects. At the same time, however, it may offer many advantageous options in terms of recognizing movement and displaying information by way of the luminous display.

In a further refinement of the invention, it is possible for the transparent regions of the operating element to be provided in a central region of the operating element. They may have a distance to the outer edge of the operating element. This distance may be between 5% and 30% of the diameter of the operating element, possibly between 8% and 20% of the diameter. The particularly readily visible central region of the operating element, even when it is gripped in the outer region or on the outer edge for operating purposes, is then able to be particularly readily visible. The corresponding information or luminous displays are thus always able to be recognized well.

Advantageously, the operating apparatus is designed for the operating movement to be a rotation of the operating element. Indeed, a shifting movement or linear movement is also possible. However, a rotation is considered to be advantageous since it corresponds to normal rotational movements, such as for example in the case of hobs or stoves. Furthermore, the spatial requirements for a rotation as operating movement are considerably lower than for shifting. The design of the magnets for magnetically holding the operating element on the control panel is also simpler, and they may be arranged for example in one location or provided virtually in point form.

In a further refinement of the invention, it is possible for the transparent regions in the operating element to be formed symmetrically or evenly. They may in particular be designed so as to be rotationally symmetrical in the case of a circular or rotationally symmetrical operating element. As an alternative, various transparent regions may also be arranged so as to be rotationally symmetrical. As a result, it is possible, in the case of a rotational movement of the operating element that is provided with rotational engagement, for example with angles of rotation of 20° to 45° or even up to 60°, to arrange six to eighteen transparent regions distributed evenly in a circle or to arrange the transparent regions such that, at each second or, even better, at each rotational setting that is engaged, for an operator to see the same arrangement of transparent regions, only in that other transparent regions are arranged in each case in an alternating manner. A luminous display from below the operating element in each individual engagement position or each second one of the engagement positions may thus have exactly the same appearance for an operator from above. This has the advantage that the operator is then in each case able to readily and easily recognize and understand the luminous display independently of a rotational position of the operating element.

In a further refinement of the invention, it is possible for the at least one holding magnet to bear and/or be fastened directly on the underside of the control panel, for example to be pressed on or to be adhesively bonded. Advantageously, a plurality of holding magnets are arranged underneath the control panel, particularly advantageously in a ring-shaped arrangement or along a ring, in particular along a circular ring. As a result, it is possible to achieve rotational mounting for the operating element. At the same time, central magnets may be dispensed with both underneath the control panel and in the operating element, which makes it possible to provide the mentioned transparent regions in this case in the centre itself in order to depict a luminous display at the top of the operating element or on the upper side thereof.

A plurality of holding magnets and a plurality of counter-magnets may be provided, between which the control panel is arranged or runs. The holding magnets and the counter-magnets are advantageously arranged so as to correspond to one another. This may be such that a counter-magnet lies opposite each holding magnet and does so at least in one position or rotational position, advantageously in a plurality of or even during an entire rotation or movement of the operating element. The holding magnets and the counter-magnets may be offset with respect to their respectively adjacent magnets, possibly also designed so as to be at least partly antipole, such that they simultaneously form the rotational engagement or engagement mentioned at the outset for a movement of the operating element. This is however known in principle from the prior art.

It is likewise known per se and still advantageous for the invention for the sensor means to be designed as magnetic sensor means; Hall sensors are particularly advantageous. A position or movement of the at least one counter-magnet is thus able to be detected particularly well. As an alternative the magnetic sensor means may also detect the movement of other or particularly specifically provided magnets.

In one advantageous refinement of the invention, the operating element may be an intrinsically closed and intrinsically unmovable structural unit, or one that does not intrinsically move. It may thus be designed as one part. This facilitates handling and improves cleaning of the operating element, which is important precisely when applying the operating apparatus in an electric cooking device, such as a hob or the like. It is also thus possible to prevent fluids or harmful substances penetrating into the operating element and possibly being able to lead to impairment of the functioning thereof. The operating element may for example be adhesively bonded from a plurality of components. As an alternative it may be cast. It may also be manufactured at least partly through multicomponent injection moulding. It is likewise possible to produce the operating element from a plurality of components that are screwed to one another. A solid cohesion and possible sealtightness are also achievable thereby.

The operating element may advantageously be manufactured at least partly through 3D printing. Particularly advantageously, the transparent regions may also be manufactured through 3D printing, which is possible for example for lenses and light guides. Similarly to an abovementioned multicomponent injection moulding process, different materials having different tasks or functions are thus able to be solidly joined together. This facilitates manufacture and improves mechanical strength.

In an alternative refinement of the invention, the operating element may be designed in several parts, such that it is intrinsically movable. It may thus have components able to move with respect to one another that are also able to move as desired or in a targeted manner with respect to one another. Such ability to move with respect to one another may be utilized for example in an operating procedure, with part of the operating element remaining unmoved, for example being connected to the control panel or being fixedly held thereon. Another part of the operating element may be moved with respect thereto, and this movement may be evaluated and used for example as operating movement. A component may in this case be a support holder that is installed or placed flat on the upper side of the control panel. It may be held there, advantageously protected against slipping through high surface friction through a corresponding selection of material on an underside of the support holder and by way of the magnetic holding mentioned at the outset. The support holder is thus held so as to be fixed in terms of location, but may be detached with an appropriate application of force.

Another component is able to move rotationally relative to the described support holder, and advantageously forms a rotary knob. This has the advantage that the magnetic holding does not have to allow any degree of movement, but rather the support holder is simply held fixedly, which may be improved by the abovementioned anti-slip coating. The implemented rotational movement, possibly also a corresponding engagement or incrementation, may be achieved independently of magnetic force or magnets, by providing corresponding constructive means between the support holder and the rotary knob. Then, there is also no need for parts of an engagement apparatus to be provided on the control panel.

An anti-slip or slip prevention underside of the support holder may for example be achieved through silicone. This has the additional advantage that the underside is then temperature-resistant, and temperature problems are then less critical, specifically including when using the control apparatus on a hob as electrical device. Silicone is furthermore able to be cleaned very well and thus retains the slip prevention properties. The underside may in particular be designed so as to be anti-slip or to prevent slipping along an outer circumference, for example with a flat coating with silicone.

As an alternative to a hob, it may be a household device that uses water, having a front region as the front, which forms the control panel for the operating device. It may thus advantageously be a washing machine, a tumble dryer, a washer dryer as a combined device or a dishwasher.

An abovementioned support holder may be designed so as to be ring-shaped and have a free central region. As an alternative, the central region may be designed so as to be transparent for the luminous display or the shining of the lighting means. A width of such a ring-shaped support holder, that is to say of the circumferential ring, may be between 5% and 20% of the diameter of the overall operating element. The support holder may laterally protrude slightly beyond the rotary knob able to move rotationally with respect thereto, such that the rotary knob is held and guided from the outside or on its radial outer side, which allows particularly secure and precise guidance. In addition, an abovementioned engagement or engagement apparatus may also be provided here. For such an engagement apparatus, mechanical engagement elements are preferably arranged between the support holder and the rotary knob. These may be designed in a manner known per se, for example with protrusions and/or recesses that are moved or rotated with respect to one another and in so doing interlock with one another and disengage from one another for the engagement. In this case, the protrusions may also be elastic or resilient, for example. Such engagement apparatuses are however known per se.

For good operability or gripability, the rotary knob may furthermore be higher than the support holder, such that it is able to be gripped externally by fingers that do not make contact with the support holder or unintentionally attempt to rotate the support holder therewith. A height of 2 to 5 mm above the plane of the control panel is considered to be an advantageous maximum for the support holder. It is also possible for the rotary knob to protrude beyond the support holder, in its outer region or with an outer edge or an outer casing, by at least 5 mm, advantageously 8 mm to 20 mm. The rotary knob is then able to be gripped and rotated well.

The engagement apparatus may also be designed so as to be magnetic, even when dividing the operating element into a support holder and a rotary knob able to move rotationally with respect thereto. To this end, similarly to as described above, it may have attractive and repulsive magnets. This is also known per se from the prior art.

Advantageously, the rotary knob may be able to be removed from the support holder or taken out thereof, such that this constitutes a movement in a direction away from the control panel. This movement may in particular be perpendicular to the control panel. A situation is thereby able to be achieved whereby a lateral guidance or guidance counter to a lateral relative movement of the two parts with respect one another is provided. The rotary knob is thus also well and practically held or mounted on the support holder.

In one advantageous refinement of the invention, it is possible to form the transparent regions of the operating element through a multiplicity of light guides, for example more than ten light guides, in particular more than twenty light guides or even more than fifty light guides. These light guides may be parallel and bear against one another inside the operating element. They may be arranged such that they are aligned parallel to one another. In addition to the abovementioned possible transparent regions in the form of parts having a specific cross section, for example circular ring segments, alternatively triangular, square or rectangular cross sections, it may also be the case that the light guides are thin optical fibres. A diameter may be a maximum of 3 mm, in particular a maximum of 1 mm. The light guides may thus advantageously be designed as normal light guides, as it were, as are used for example for data transmission. If such relatively thin light guides are used to form a thick bundle or a large number of them are used, for example having an area of 2 cm$^2$ to 10 cm$^2$, then several hundred light guides are provided in the operating element, and these are accordingly transparent. The advantage of this design of the transparent region or of the transparent regions of the operating element is that a very sharp depiction of a luminous display or luminous appearance shone in from below is possible, as it were. There is in fact no distortion whatsoever. The effect of a display may furthermore even be utilized, which is divided as it were in pixel form or into pixels and appears in a manner depicted by pixels. An optically particularly attractive luminous display is thus created. Through such a large number of light guides or transparent regions, a situation is furthermore able to be achieved whereby a luminous display is fixed underneath the control panel, and it seems or appears fixed, as it were, even when rotating the control element or rotary knob on the upper side thereof. A situation is thereby able to be achieved whereby the luminous display is always well recognizable and is always able to be read or understood.

In yet another refinement of the invention, it may be provided for a plurality of abovementioned transparent regions or light guides, in their longitudinal extent away from the control panel, in particular substantially perpendicular thereto, to change their cross-sectional area. In particular, they may increase their cross-sectional area. It is thereby possible to achieve a kind of magnification effect, and a relatively small luminous display underneath the control panel may appear larger on the upper side of the operating element or of the rotary knob, possibly even significantly larger, for example at least 50% larger.

If the transparent regions of the operating element are formed by light guides, but not by thin optical fibres, as explained above, but rather by individual parts that have a cross-sectional area for example of more than 2 mm$^2$ or even more than 4 mm$^2$ and up to 49 mm$^2$, then these may be designed as individual separate parts. They may then be joined together, for example adhesively bonded. Opaque regions should then however be formed between them, or their outer sides should at least be machined such that no light is shone in in the lateral direction from a transparent region into the other adjacent transparent region.

In a further refinement of the invention, it is possible to provide at least one transparent region, in particular a light guide, on the abovementioned support holder. This may be relatively small, alternatively it may extend at least partly along the ring shape of the support holder, particularly advantageously completely surround it as ring-shaped light guide. A second luminous display or illumination may thus be created, independently of the abovementioned main luminous display by way of the lighting means mentioned at the outset. It may thus for example be indicated that the corresponding operating element of the operating apparatus is provided for actuation, for example because it has been selected beforehand in a manner known per se.

Light may also be shone into an abovementioned light guide by a lighting means underneath the control panel. To this end, a plurality of lighting means are advantageously provided underneath the control panel for a uniform and intense illumination.

The illumination of the lighting means may in this case be controlled in a uniform or pulsed manner. Brief pulses with a very high intensity may in this case be perceived as a uniform appearance, corresponding to continuous illumination. The lighting means may in this case also change the light intensity and/or its colour. In the context of the invention, it is possible to change the type of pulse and/or the light intensity or colour depending on the presence of the operating element and/or the position of the operating element. In addition to changing the intensity or pulse duration of the diodes, it is also possible to control the colours and appearances using a fast-moving MEMS mirror, known per se.

In a first further refinement of the invention, light from the lighting means shines directly upwards through the operating element or through the transparent regions, and it is possibly deflected, bundled or broadened in the process. In this case, it is however always still the same light.

In a second, different refinement of the invention, light from the lighting means shines into the operating element, and does so into an abovementioned transparent region. This may be a light guide or be transparent. Primarily, however, the light from the lighting means, which may advantageously be UV light and is thus invisible to an operator, in the transparent region or light guides excites the formation of light at a different wavelength, namely in the visible wavelength region. This visible and as it were converted light is then forwarded upwards from the transparent region in the manner described above and is visible from above to an operator, as is otherwise also the case with direct shining. Division into a plurality of transparent regions is thus also possible, these also being able to be illuminated or excited individually. The same display options are thus provided as in the case of direct shining, as were described above. Only the directly visible lighting effect is generated in a different manner, and it is thus other light, as it were.

Such material for the transparent region is known as UV-stimulable material from DE 102015212915 A1, to which express reference is made in this respect. The lighting means may advantageously be a corresponding UV LED.

These and other features emerge not only from the claims but also from the description and the drawings, the individual features each being able to be implemented on their own or in multiple form in the form of sub-combinations in an embodiment of the invention and in other fields and being able to constitute advantageous embodiments worthy of protection on their own and for which protection is claimed here. The division of the application into intermediate headings and individual paragraphs does not restrict the statements made therein in terms of their general applicability.

BRIEF DESCRIPTION OF THE DRAWINGS

Exemplary embodiments of the invention are illustrated schematically in the drawings and are explained in more detail below. In the drawings.

DETAILED DESCRIPTION

Figure 1:
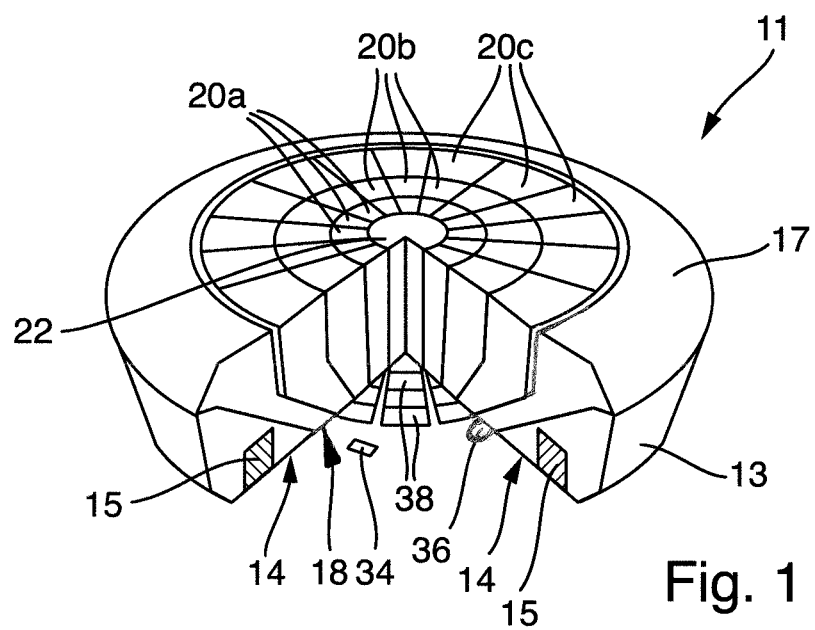
FIG. 1 shows an oblique view of an operating element of an operating apparatus according to the invention, having a plurality of transparent regions along concentric rings.

FIG. 1 shows an oblique illustration of an operating element according to the invention for an operating apparatus according to the invention. The operating element 11 is designed in the manner of a control knob mentioned at the outset as what is known as a rotary knob, and reference is made in particular to EP 2 444 736 A2. As shown by the partial section, the operating element 11 has an externally circumferential base ring 13. This may consist of plastic, alternatively of non-magnetizable material, such as aluminium. The base ring 13 has an underside 14 by way of which the operating element 11 may be placed on an upper side of a control panel, not illustrated here, for example of a glass ceramic plate as a hob plate of a hob. Countermagnets 15 are inlaid, advantageously adhesively bonded or fastened into the underside 14 at regular intervals, for example 10° to 15° or 0.5 cm to 1 cm. These countermagnets 15 may have a rectangular cross section as seen in the vertical direction, with a smaller width in the circumferential direction than in the radial direction; alternatively they may also have a round or square cross section. The underside 14 may also be provided with a coating that allows particularly slight gliding, for example made from PTFE.

Inside the base ring 13 there is arranged a luminous ring 17 that is precisely tailored to the inwardly and upwardly pointing inclination of the base ring 13. The luminous ring 17 is transparent, advantageously translucent, and may consist of a suitable plastic. The luminous ring 17 has a narrow underside 18 that forms a circumferential circular ring surface having a small width in the radial direction. Light may shine here from LEDs 36 arranged underneath, which are arranged under a control panel, not illustrated, for an optical display on an upper side of the luminous ring 17. By way of example, this may be an item of location information or a cooker setting display.

In the central large opening of the luminous ring 17 there are arranged a plurality of different transparent regions 20. Transparent regions 20a, specifically thirteen of them, are provided along an innermost region. Central transparent regions 20b are arranged so as to externally adjoin these, again as circular ring segments, but this time slightly wider, namely sixteen of them. Transparent regions 20c are again provided so as to externally join these, specifically again sixteen of them. It is able to be seen that the division in the circumferential direction between the transparent regions 20b and 20c is the same, that is to say they each enclose the same angular segment with an angle of 22.5°.

The transparent regions 20a, 20b and 20c, unlike the translucent material of the luminous ring 17, are as transparent or see-through as possible. They may be slightly coloured in order to display a coloured light appearance, but should allow through as much light as possible for the highest possible intensity of the light appearance. To this end, a display surface 38 is provided underneath with individual LEDs, the individual LEDs advantageously being arranged or distributed exactly the same as the transparent regions 20a, 20b and 20c in a rotational position of the operating element 11. The LEDs of the display surface 38 and the transparent regions 20a to 20c are then advantageously congruent.

Owing to spatial reasons and the specific construction, in particular due to the lower wider base on the underside 14 of the base ring 13, the outer transparent regions 20b and 20c, similarly to the luminous ring 17, are designed so as to be drawn down slightly inward and so as to be narrower. However, this does not disrupt light illumination and light guidance.

A capacitive sensor element 22 is provided centrally in the centre, where an axis of rotation of the operating element 11 also runs. Said sensor element advantageously consists of electrically conductive material, for example metal or a plastic correspondingly mixed with additives. Under the control panel, underneath the capacitive sensor element 22, there is a further capacitive sensor element, preferably an electrically conductive surface, which is able as it were to detect a finger being placed on the upper side of the capacitive sensor element 22 with capacitive coupling through the control panel on the underside. For this purpose, reference is made to DE 10 2011 007 112 A1, which describes a corresponding subject matter, and to U.S. Pat. No. 7,642,673 B2.

The operating element 11 may also have a covering on its upper side, which is for example transparent and in the form of a lacquer or coating, alternatively as a component corresponding to a disc or a cap. Corresponding transparency again then gives all display functions, and the operating function by way of the capacitive sensor element 22 is also maintained.

FIG. 1 furthermore also illustrates an individual Hall sensor 34, which is advantageously arranged on the same component carrier as the LEDs 36 and the display surface 38. The Hall sensor 34 is arranged, advantageously together with further sensors, on a circular track underneath the counter-magnets 15, in order to detect their rotational movement and thus a rotational movement of the operating element 11. This is sufficiently known to those skilled in the art, and reference is made in this respect to the abovementioned prior art.

The holding magnets, not illustrated here, for the operating element 11 are advantageously also arranged on this component carrier.

Figure 2:
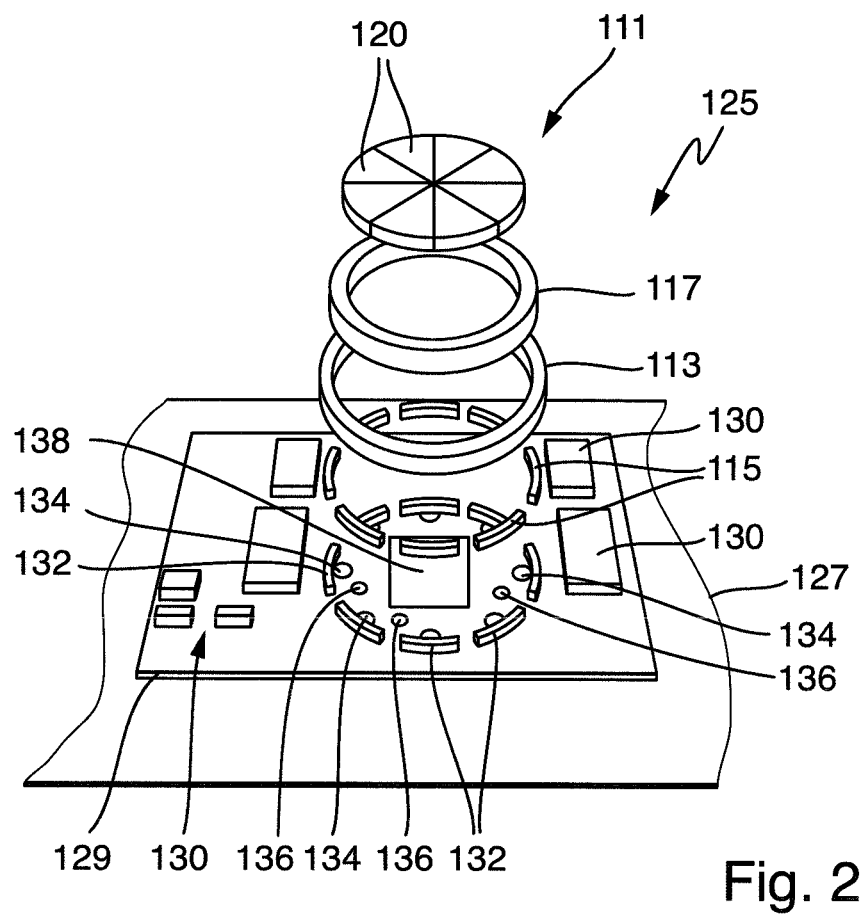
FIG. 2 shows an operating apparatus according to the invention with an alternatively designed operating element, including holding magnets and counter-magnets arranged circumferentially on the outside in the shape of a ring.

FIG. 2 illustrates a complete operating apparatus 125 according to the invention in an oblique exploded illustration. An operating element 111, which likewise has a disc shape in the assembled state, has an externally circumferential base ring 113. Eight counter-magnets 115 designed in the shape of an arc are inserted and adhesively bonded in its underside. A luminous ring 117, advantageously again consisting of translucent material, is arranged in the base ring 113. In the central opening of the luminous ring 117 there is provided a disc having eight transparent regions 120, these transparent regions 120 being optically separated from one another as sectors. This means that, by illuminating an individual transparent region 120, no light is shone into the adjacent regions. Eight transparent regions 120 divided into sectors and that are the same size here are thus provided in the case of the operating element 111.

The operating element 111 is placed on an illustrated control panel 127 of the operating apparatus 125 in the case of application. It is held and centred during rotation by holding magnets 132, which were described at the outset, arranged under the control panel 127 on a circuit board 129. The holding magnets 132 are designed like the counter-magnets 115 and also arranged exactly accordingly, as shown by the illustration. A corresponding arrangement may also be provided for the operating element 11 in FIG. 1. Various control components 130 are provided on the circuit board 129.

By virtue of the specific arrangement of the holding magnets 132 and of the counter-magnets 115, it is possible to centre or precisely guide the operating element 111 during rotation or during operation, similarly to as is known in the prior art, in particular for the abovementioned DE 10 2005 049 995 A1 or the abovementioned DE 10 2011 007 463 A1. The central region in this case remains free from magnets, however.

Radially just inside the holding magnets 132 there are provided Hall sensors 134 that are able to recognize a change in the magnetic field during rotation of the operating element 111 and are able to recognize and in particular analyse the rotational movement therefrom. To this end, reference is made to the prior art in respect of further details, in particular in respect of recognizing the rotational position.

Once again, slightly radially inside the Hall sensors 134, LEDs 136 are arranged on the circuit board 129, specifically exactly underneath the luminous ring 117. Through varying activation or illumination of various LEDs 136, it is possible, depending on how far an illuminated strip runs around the luminous ring 117, for example to display a cooker setting or a kind of timer countdown. Many possibilities are able to be recognized and imagined and easily able to be implemented by those skilled in the art here.

Inside the ring of holding magnets 132 or in a central region there is provided a display surface 138 in the form of a rectangle. This advantageously consists of a matrix-type arrangement of LEDs in rows and columns so as to form various display possibilities. Alternatively, a display surface 138 may also be divided into angular sectors, similarly to the transparent regions 120 themselves.

The arrangement of holding magnets 132 and counter-magnets 115, including respective polarity with attractive force, is advantageously such that there is a resultant kind of magnetic engagement. This means that the operating element 111 is always moved automatically into one of the rotational positions in which a counter-magnet 115 is exactly above a holding magnet 132. Such magnetic engagement is perceived to be attractive and advantageous by an operator, as it corresponds largely to a mechanical engagement in terms of haptics and provides for more precise operation and a certain haptic feedback to an operator.

Figure 3:
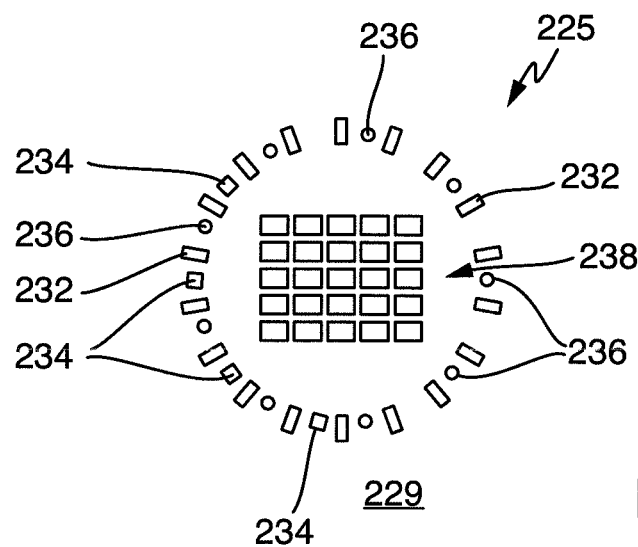
FIG. 3 shows a plan view of part of a further operating apparatus according to the invention having holding magnets arranged on the outside in the shape of a ring, and a centrally arranged display area.

FIG. 3 illustrates a plan view of part of yet another operating apparatus 225 according to the invention under a control panel, specifically that part that is arranged on a circuit board 229. The control components on the circuit board 229 are not present here, but these are easily able to be imagined. Although the holding magnets 232 are in this case also designed so as to be short and elongate, they are designed so as to run in the radial direction and not in the circumferential direction as in FIG. 2. This could thus correspond for example to the operating element 11 from FIG. 1. Between the holding magnets 232 there are arranged a plurality of Hall sensors 234 with the same function as described with respect to FIG. 2, but just in a slightly different position.

LEDs 236 are furthermore arranged between the holding magnets 232, but just in every second gap. These may shine into a luminous ring arranged directly thereabove, as described below in FIG. 4.

A rectangular display surface 238, similar to that of FIG. 2, specifically having five rectangular individual elements, is situated in a central region. These are in particular individual LEDs, such as for example SMD LEDs, each having five per row and per column.

In a hob having four or especially having more than four separate hob areas, a display surface according to FIG. 3 may also be provided so as to indicate, by illuminating a plurality of the individual LEDs or light sources, the location at which a pan has been placed on a hob surface, for which pan a heating power is set by way of the operating element belonging to this display surface 238. The operating element itself may thus also indicate to an operator regions on the hob surface corresponding to a placed pan which should be adjusted in terms of the power thereof. The corresponding power increment may then be proportionally indicated by the outer ring or luminous ring on the operator element by way of the LEDs 236. Alternatively, unused lighting elements of the display surface 238 may also be used for this purpose.

Figure 4:
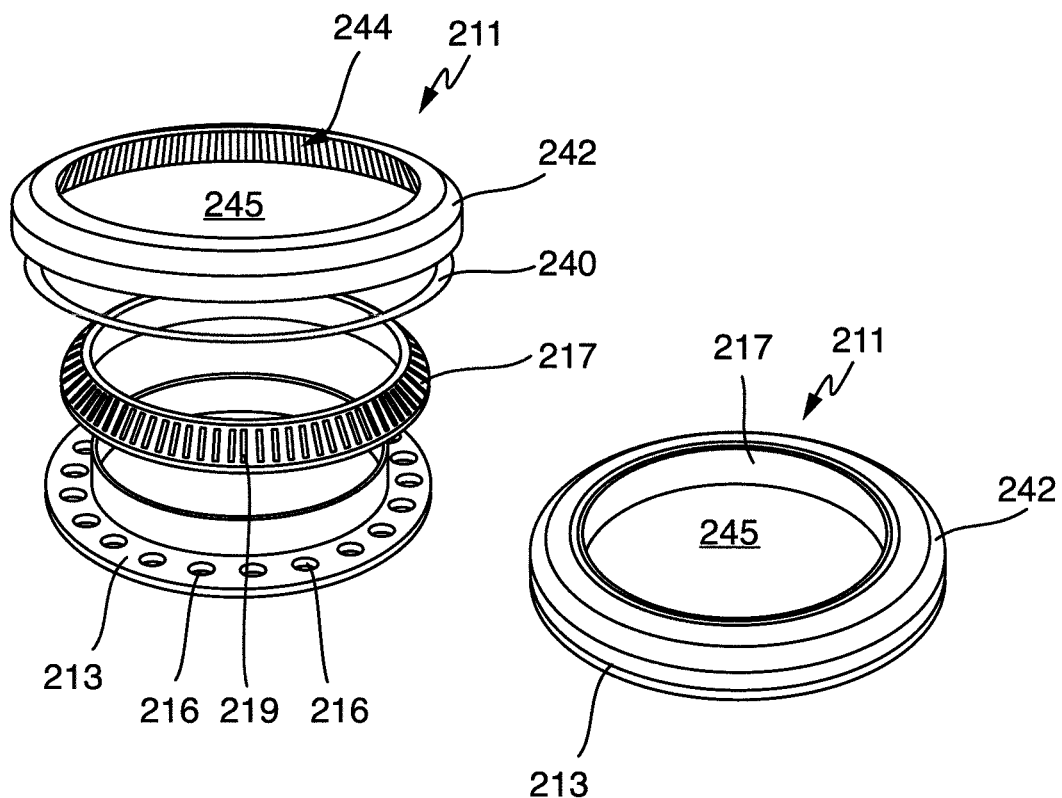
FIG. 4 shows an illustration of yet another operating element for the operating apparatus from FIG. 3, consisting of a plurality of combined parts in an exploded illustration of these parts and in an assembled illustration, a central region being completely free.

The appropriate operating element 211 is illustrated in FIG. 4, specifically in a pulled-apart or exploded illustration on the left-hand side, and assembled on the right-hand side. The operating element 211 has a base ring 213 that is shaped as a kind of quite short pipe section or wide ring with an externally protruding flat flange. Holes 216 are formed in this flange, specifically in a pattern corresponding to the holding magnets 232 or in a pattern that is twice as close as that of the LEDs 236.

The Hall sensors 234 could at least partly also be arranged at uneven intervals in the circumferential direction such that they are able to recognize not only a general rotational movement of an operating element thereabove by way of a changing magnetic field, but rather especially are also able to recognize a direction of rotation or a change of direction of rotation. This is however known to those skilled in the art from the prior art.

The base ring 213 in this case does not have a dedicated magnet, and in this respect it should itself consist for example of magnetic material, such as iron or the like. It may be provided on its underside with a coating with good adhesion, for example with silicone. As a result, if it is placed on a control panel similar to FIG. 2, it is able to adhere, as it were, and be rotated only with a greater application of force on the control panel or the surface thereof. By contrast, removal may be performed very easily, and to this end only the magnetic attractive force of the iron base ring 213 with respect to the holding magnets 232 needs to be overcome.

A luminous ring 217, made of translucent material, is placed on the base ring 213. Said luminous ring has a roughly triangular cross section with a wide base that covers all holes 216, so that light shone from the LEDs 236 from below is able to shine into the luminous ring 217.

The luminous ring 213, on its oblique outwardly pointing side, is provided with a kind of engagement 219 with very fine incrementation. This has a multiplicity of small rib-shaped protrusions. The luminous ring is advantageously fixedly connected to the base ring 213, and in any case it should not be able to move with respect thereto.

An outer ring 242, for example consisting of aluminium, alternatively of plastic, is placed on the luminous ring 217. On its inner side, the outer ring 242 has an inner engagement 244 that interacts with the engagement 219 of the luminous ring 217 such that, upon rotation of the two parts with respect to one another, a conventional rotational engagement is achieved in a mechanical manner. The outer ring 242 may lie directly on the base ring 213 with a narrow outer ring region. To reduce friction, a narrow sliding ring 240 may be provided here.

The outer ring 242 has a recessed and therefore free central region 245 or surrounds the latter. The operating element 211 illustrated on the right-hand side in FIG. 4 thus gives a kind of intrinsically movable or rotatable ring in which the base ring 213 is held magnetically on a control panel. By way of a mechanical engagement, the outer ring 242 is able to be rotated with respect to the luminous ring 217 attached to the base ring 213 with a fine rotational engagement. The luminous ring 217 is in this case able to be seen from above with a narrow circumferential ring on the top side, such that the light from the LEDs 236 shines through in sections here.

The operating element 211 may in particular be held by magnetic force here. Alternatively, it may also be pressed together by magnetic force if the base ring 213 is not magnetic, but rather consists of aluminium or of plastic. The outer ring 242 then consists of magnetic or ferromagnetic material. It is pulled downwards by the holding magnets 232 under the control panel and thus also presses against the base ring and thus presses this against the control panel. The individual parts of the operating element 211 are thus held together, and a certain pressing pressure is exerted on the base ring 213, such that this lies fixedly on an upper side of the control panel, as it were. The base ring may have a slip prevention surface on its underside. To amplify the effect of the holding together, small but strong magnets may be arranged in the outer ring 242 in order to interact with the holding magnets 232. This is possible in accordance with a whole or divided pattern of the holding magnets 232, or alternatively in a completely separate division. Such magnets in the rotatable base ring 213 may also in turn improve recognition of a rotational movement by way of the Hall sensors 234.

By virtue of the free central region 245, the display surface 238 is able to be recognized well or is freely visible. A kind of transparent disc or subdivision similar to FIG. 1 or 2 may possibly be provided in the free central region 245, said disc or subdivision then being able to be provided on the luminous ring 217, but also alternatively on the outer ring 242 or on the base ring 213. This free central region 245 forms one of the transparent regions according to the invention, and another is formed by the luminous ring 217 separated therefrom. This operating element 211 thus still has two transparent regions according to the invention.

Figure 5:
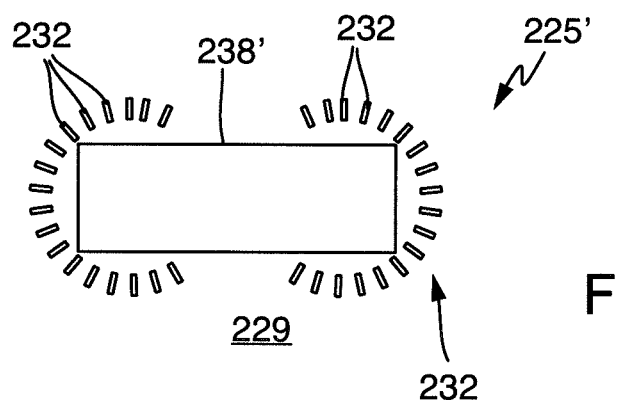
FIG. 5 shows a plan view of a variant of the operating apparatus from FIG. 3, having two ring-shaped arrangements of holding magnets next to one another and a large-area, connecting display as display area.

FIG. 5, referring back to the operating apparatus from FIG. 3, illustrates a further operating apparatus 225' having holding magnets 232' similar to FIG. 3, but just in a closer pattern. These holding magnets 232' furthermore do not run completely circumferentially or do not form a closed circle, but rather are adjacent to one another and as it were open or interrupted in this direction. A large-area display surface 238' is provided here, the left-hand region of which is covered by a left-hand partial ring of holding magnets 232' or is covered by a corresponding operating element, whereas a right-hand region is exactly the same in mirror image form. Holding and centering of an operating element similarly to FIG. 4 is also possible to a very good extent through this non-closed circumferential arrangement of the holding magnets 232'. Its rotational movement or rotational actuation is likewise able to be recognized, in particular by way of suitable Hall sensors. With such an operating apparatus 225', two operating elements 211 according to FIG. 4 are thus able to be placed relatively close to one another. In the case of an application in a hob having four hob areas or four desired operating elements, two of these dual arrangements may then be provided below one another or else next to one another. By virtue of the large-area display surface 238', connection expenditure may thus possibly be saved in comparison with two smaller display surfaces. Something may likewise be indicated in the central region between the two operating elements.

Figure 6:
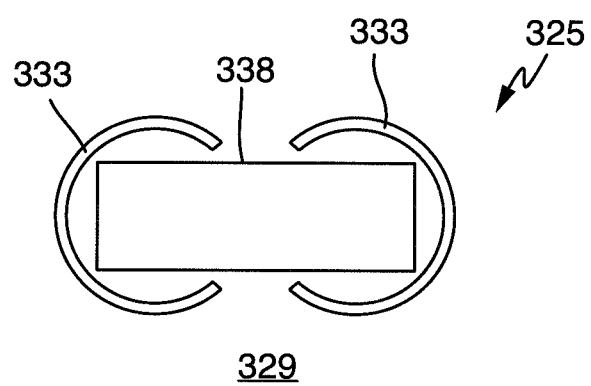
FIG. 6 shows a variant of the operating apparatus from FIG. 5.

FIG. 6 illustrates yet another operating apparatus 325, which also has an elongated display area 338, similar to FIG. 5. It is designed for two operating elements, similar to FIG. 4, which are arranged next to one another. Unlike the design of FIG. 5, a single continuous elongate magnetic partial ring 333 corresponding to an abovementioned holding magnet is provided per operating element. No engagement may then be provided, or alternatively this may be achieved by individual counter-magnets on the operating element arranged thereabove, if these match the ends of the magnetic partial ring 333. An engagement may likewise be provided inside the operating element, as illustrated in FIG. 4. No LEDs or Hall sensors or the like are shown in this operating apparatus 325, but these are easily imaginable.

Figure 7:
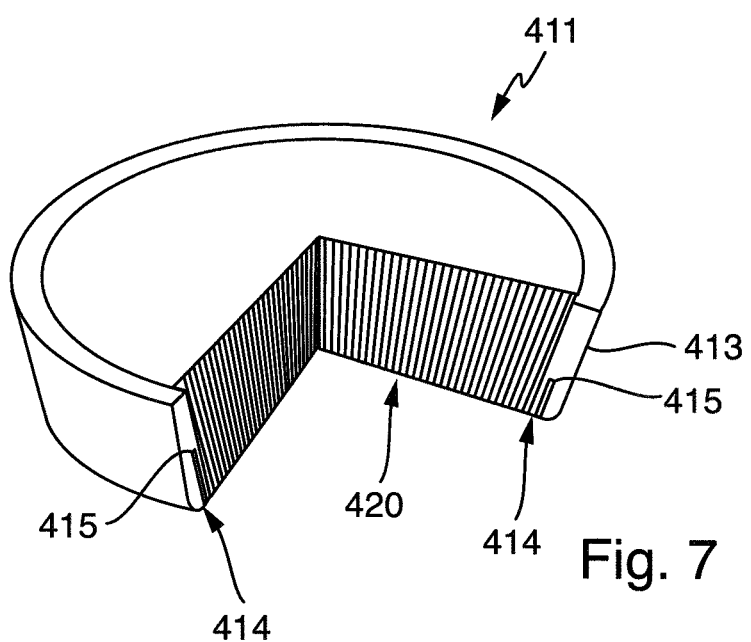
FIG. 7 shows yet another refinement of an operating element according to the invention having a circumferential outer ring, in the centre region of which there is arranged a large number of parallel light guides as a bundle.

Yet another possible operating element according to the invention is illustrated in FIG. 7. It slightly resembles the operating element 11 from FIG. 1. The operating element 411 has an externally circumferential base ring 413, advantageously made from non-magnetic and non-magnetizable material, such as plastic or aluminium. Counter-magnets 415 running in a circumferential direction are inserted on a relatively narrow underside 414, similarly to the case of the operating element 111 in FIG. 2. There may be for example eight, twelve or sixteen counter-magnets 415. The appropriate operating apparatus has, similarly to as in FIG. 2, accordingly designed holding magnets and Hall sensors for magnetic fastening and for recognizing a rotational movement.

A multiplicity of light guides running in a vertical direction are provided as transparent regions 420 inside the base ring 413. The number may be very high, and there may also be for example a light guide or glass fibre bundle. There may thus be up to several hundred individual light guides as transparent regions according to the invention, which in particular also do not necessarily have to be ordered or arranged in a specific pattern. They should only be arranged close to one another, preferably directly in contact, and advantageously uniformly, in particular have the same dimensions. If this operating element 411 is arranged on an operating apparatus having a display surface, for example according to FIG. 2, 3, 5 or 6, then the light guides of the transparent regions 420 transmit as it were the light appearance upwards from below in almost exactly unchanged form. A kind of pixelated depiction with a pixel size corresponding to the cross-sectional area of the light guides thus results on an upper side of the operating element 411. This may even be desirably attractive or advantageous.

The invention claimed is:

1. Operating apparatus for an electrical device, said operating apparatus comprising:
a flat control panel being closed and being at least regionally transparent,
lighting means underneath said control panel in order to shine through said control panel from below,
at least one holding magnet underneath said control panel,
a movable operating element that is arranged on a front side of said control panel so as to be able to move with respect to said lighting means and with respect to said at least one holding magnet, wherein said operating element is held magnetically,
at least one counter-magnet in or on said operating element for interacting with said at least one holding magnet through attractive magnetic force, such that said operating element, in case of an operating movement, is guided by said attractive magnetic force between said holding magnet and said counter-magnet, and such that said operating element is held on said control panel,
sensor means on or underneath said control panel, wherein said sensor means are designed to detect a position or a rotational position of said operating element,
wherein:
said operating element is transparent in a direction running from said lighting means to said operating element,
said operating element has a central region, a plurality of transparent regions providing the transparent nature of said operating element, and an outer edge surrounding said central region,
said plurality of transparent regions are disconnected from one another or separated from one another without transmitting light between one another,
said transparent regions of said operating element are provided at least in said central region of said operating element and at a distance from said outer edge of said operating element, and
said transparent regions of said operating element are formed by a multiplicity of light guides having an alignment parallel to one another and bearing against one another inside said operating element.

2. Operating apparatus according to claim 1, wherein said distance is between 5% and 30% of a diameter of said operating element.

3. Operating apparatus according to claim 1, wherein said operating movement is a rotation of said operating element.

4. Operating apparatus according to claim 1, wherein said transparent regions in said operating element are designed so as to be symmetrical or uniform.

5. Operating apparatus according to claim 4, wherein said transparent regions in said operating element are designed so as to be rotationally symmetrical in case of said operating element being circular or being rotationally symmetrical.

6. Operating apparatus according to claim 1, wherein said light guides are designed as thin optical fibres with a diameter of a maximum of 3 mm.

7. Operating apparatus according to claim 1, wherein said light guides, in a longitudinal extent away from said control panel, change their cross-sectional area.

8. Operating apparatus according to claim 1, wherein:
said control panel has an underside, and
said at least one holding magnet bears or is fastened directly on the underside of said control panel.

9. Operating apparatus according to claim 8, wherein:
said at least one holding magnet comprises a plurality of holding magnets, and
said plurality of said holding magnets are arranged underneath said control panel in a ring-shaped arrangement or along a ring.

10. Operating apparatus according to claim 1, wherein:
said at least one holding magnet comprises a plurality of holding magnets, said at least one counter-magnet comprises a plurality of counter-magnets, said plurality of holding magnets and said plurality of counter-magnets are provided with said control panel arranged between them, and each of said plurality of holding magnets and said plurality of counter-magnets are arranged so as to correspond to one another.

11. Operating apparatus according to claim 10, wherein in each case one of said counter-magnets lies opposite one of said holding magnets.

12. Operating apparatus according to claim 1, wherein said sensor means are designed as magnetic sensor means, and detect a position or movement of said at least one counter-magnet.

13. Operating apparatus according to claim 1, wherein said operating element is an intrinsically closed and intrinsically unmovable structural unit and is designed as one part.

14. Operating apparatus according to claim 1, wherein said operating element is designed in several parts and is intrinsically movable or has components able to move with respect to one another.

15. Operating apparatus according to claim 14, wherein said components are rotatable and one component is a support holder to be placed on an upper side of said control panel, such that said support holder is held fixed in terms of location or in a removable manner there, and another component is a rotary knob configured to move rotationally with respect thereto.

16. Operating apparatus according to claim 15, wherein said support holder is be ring-shaped with a free central region.

17. Operating apparatus according to claim 15, wherein said rotary knob is configured to be removed from said support holder in a direction away from said control panel.

18. An electrical device comprising baying an operating apparatus comprising:
- a flat control panel being closed and being at least regionally transparent,
- lighting means underneath said control panel in order to shine through said control panel from below,
- at least one holding magnet underneath said control panel,
- a movable operating element that is arranged on a front side of said control panel so as to be able to move with respect to said lighting means and with respect to said at least one holding magnet, wherein said operating element is held magnetically,
- at least one counter-magnet in or on said operating element for interacting with said at least one holding magnet through attractive magnetic force, such that said operating element, in case of an operating movement, is guided by said attractive magnetic force between said holding magnet and said counter-magnet, and such that said operating element is held on said control panel,
- sensor means on or underneath said control panel, wherein said sensor means are designed to detect a position or a rotational position of said operating element, wherein:
- said operating element is transparent in a direction running from said lighting means to said operating element,
- said operating element has a central region, a plurality of transparent regions providing the transparent nature of said operating element, and an outer edge surrounding said central region,
- said plurality of transparent regions are disconnected from one another or separated from one another without transmitting light between one another,
- said transparent regions of said operating element are provided at least in said central region of said operating element and at a distance from said outer edge of said operating element, and
- said transparent regions of said operating element are formed by a multiplicity of light guides having an alignment parallel to one another and bearing against one another inside said operating element.

19. Electrical device according to claim 18, wherein the electrical device is a hob having a hob plate and heating apparatuses arranged thereon or underneath, wherein part of said hob plate forms said control panel for said operating apparatus.

20. Electrical device according to claim 18, wherein:
the electrical device is a household device that uses water, the electrical device being selected from the group of: dishwasher, washing machine, tumble dryer, and washer dryer as a combined device, and
said household device has a front region as front that forms said control panel for said operating apparatus.

* * * * *